United States Patent [19]
Curtis

[11] 4,028,719
[45] June 7, 1977

[54] ARRAY TYPE CHARGE EXTRACTION DEVICE FOR INFRA-RED DETECTION

[75] Inventor: Orlie L. Curtis, Culver City, Calif.

[73] Assignee: Northrop Corporation, Los Angeles, Calif.

[22] Filed: Mar. 11, 1976

[21] Appl. No.: 666,165

[52] U.S. Cl. .................................. 357/30; 357/24; 307/304; 307/221 D; 250/338; 250/371
[51] Int. Cl.² .................... H01L 27/14; H01L 29/78
[58] Field of Search .......... 250/338, 340, 349, 370, 250/371; 357/24, 30; 307/304, 221 D; 350/338, 371

[56] References Cited
UNITED STATES PATENTS

| | | | |
|---|---|---|---|
| 3,877,057 | 4/1975 | Engeler | 357/24 |
| 3,882,531 | 5/1975 | Michon | 357/24 |
| 3,896,474 | 7/1975 | Amelio | 357/24 |
| 3,898,685 | 8/1975 | Engeler | 357/24 |
| 3,906,544 | 9/1975 | Engeler | 357/24 |
| 3,916,268 | 10/1975 | Engeler | 357/23 |
| 3,940,602 | 2/1976 | Lognado | 235/181 |
| 3,983,395 | 9/1976 | Kim | 250/370 |
| 3,986,197 | 10/1976 | Ablassmeier | 357/24 |

OTHER PUBLICATIONS

Nelson, *Appl. Phys. Letl.*, vol. 25, No. 10, 15 Nov. 74 pp. 568–570.

*Primary Examiner*—Martin H. Edlow
*Attorney, Agent, or Firm*—Edward A. Sokolski

[57] ABSTRACT

A plurality of infra-red detectors having storage capabilities are arranged in an array having X and Y address lines and a signal readout line. The detector elements have a semiconductor substrate of extrinsic material such as suitably doped silicon, and operate to store and provide readout of signal information using majority carriers, there being no requirement for depletion regions or P-N junctions. Majority carrier diffused regions are formed along the front surface of the substrate, the X and Y address lines and the signal line being placed adjacent to these diffused layers as well as terminals for applying a bias voltage and for forming a storage capacitor for each of these detector elements. Bias is applied in a polarity such as to attract majority carriers generated by the infra-red radiation to the surface for storage in the storage capacitor, the stored carriers providing a readout signal on the signal line when an addressing signal appears on the X and Y lines.

9 Claims, 5 Drawing Figures

ARRAY TYPE CHARGE EXTRACTION DEVICE FOR INFRA-RED DETECTION

This invention relates to infra-red sensitive semiconductor arrays for storing and providing a readout in accordance with infra-red radiation received thereby, and more particularly to such a device which utilizes a wholly extrinsic semiconductor structure.

Matrix arrays utilizing a plurality of semi-conductor radiation sensitive elements for detecting, storing and subsequently providing a readout in accordance with light energy incident thereon have become well known in the art, particularly in communication systems. Such devices generally utilize a substrate of a photo-sensitive semi-conductor material having appropriate dielectric and metallic layers deposited thereon to form storage elements, addressing elements, and readout elements. Silicon is generally favored as the substrate material in this type of device because of its economy, general availability and suitability for most applications. Prior art detectors have generally been of the intrinsic type utilizing depletion regions or junctions in their implementation and involving the generation of minority carriers.

The present invention affords an improvement over the prior art in providing a detector which operates in a matrix array and is capable of high speed readout and signal integration in the detection of infra-red radiation. This improvement is achieved by forming and operating the detector elements extrinsically, i.e., without the use of depletion regions or junctions and solely employing majority carriers in detection, storage and readout.

Briefly described, the device of the invention is as follows: An array of infra-red detection elements is formed on a common semiconductor substrate of an extrinsic material which may comprise silicon to which a suitable dopant has been added. Typically, for a P type material, a dopant such as zinc, thallium, indium or gallium may be used. A uniform diffusion layer may in certain embodiments be formed over the back surface of the substrate, an overall metal electrode being deposited on this surface. (If it is so desired, the back surface can be covered with a conductive coating such as poly-silicon, so that the infra-red radiation may be received from that direction.) The front surface of the substrate, i.e., the surface which normally receives the infra-red radiation to be detected, has X and Y address lines deposited thereon and a signal line for readout. Each detection element includes a plurality of separated diffusion layers on the front surface which may be formed by means of a boron dopant which will continue to be a source of majority carriers at operating temperature. For P type structures, boron is the normal dopant. Deposited or grown on the front surface is a layer of dielectric material such as silicon dioxide. For each of the detector elements, a conductive collector electrode is provided, this collector electrode being deposited over the dielectric layer to form a CIS (conductor-insulator-semiconductor) capacitor in conjunction with the semiconductor substrate. The collector electrode is fabricated of a material transparent to the infra-red radiation, such as poly-silicon (polycrystalline material commonly employed in integrated circuit fabrication). When infra-red radiation passes through the collector electrode and penetrates into the semiconductor substrate material, majority carriers are generated in response to this radiation. A bias voltage is placed between the surfaces of the semiconductor substrate material in a polarity such as to cause these carriers to move to the front surfaces, i.e., towards the collector electrode. A charge is thus stored on the capacitor formed between the collector electrode and the substrate, this charge being in accordance with the radiation received. The X, Y and signal lines are placed in the vicinity of the diffusion layers so that when an addressing signal is applied to the X and Y lines, the charge stored beneath the collector electrode is transferred to the signal electrode, these elements forming a dual-gate MOSFET in conjunction with the diffusion layers.

The invention will now be described in connection with the accompanying drawings, of which:

Figure 1:
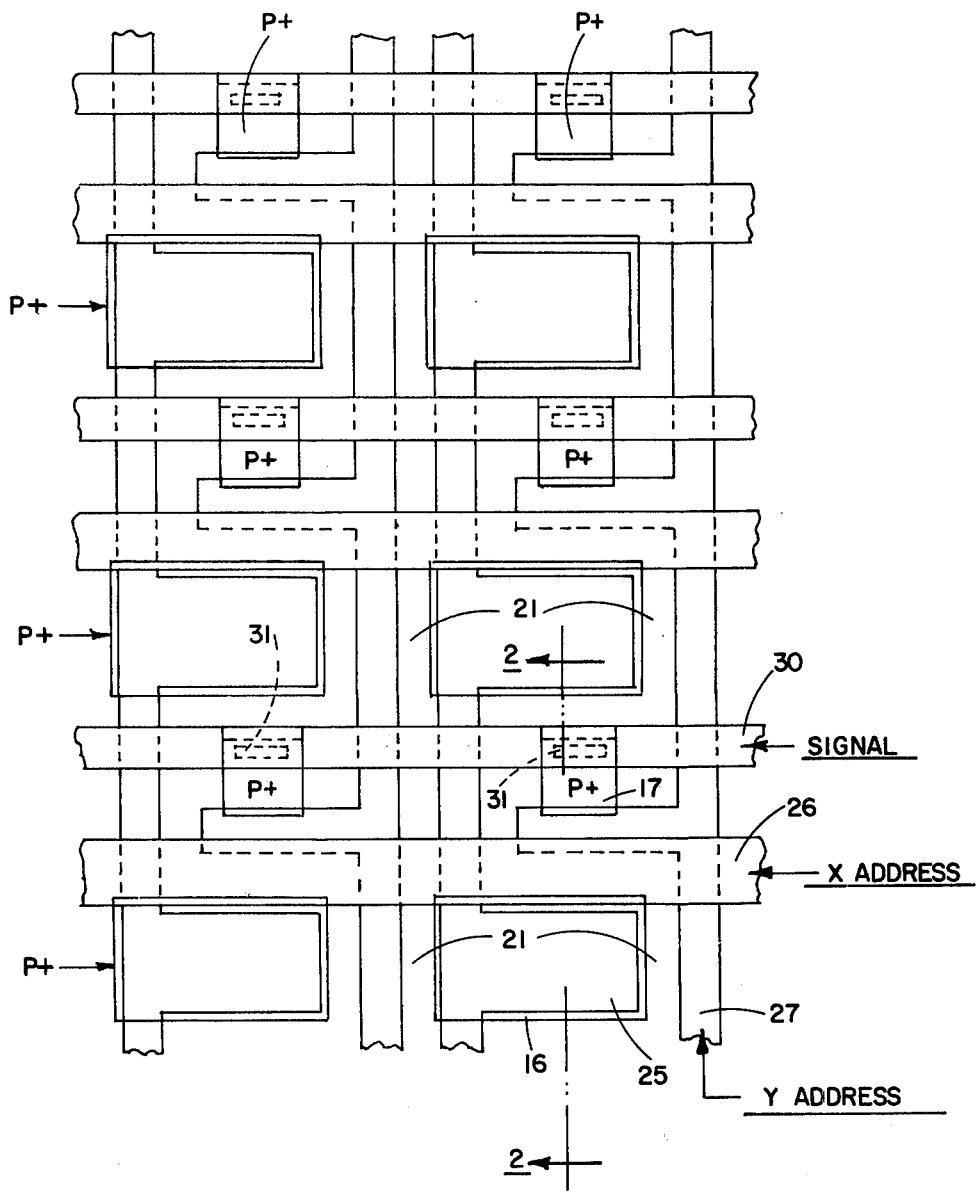
FIG. 1 is a top plan view of one embodiment of the invention.
Figure 2:
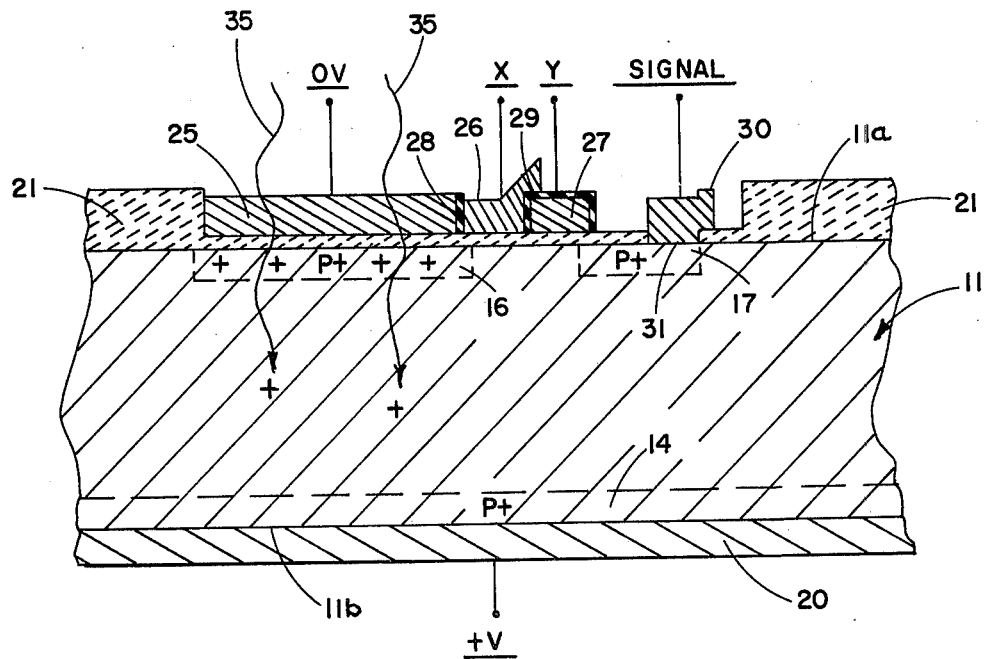
FIG. 2 is a cross-sectional view taken along the plane indicated by 2—2 in FIG. 1.

Referring now to FIGS. 1 and 2, a first embodiment of the invention is illustrated. Substrate 11 is of a semiconductor such as silicon which has been treated with an appropriate dopant to make the material either P or N type. For illustrative purposes, the device of the invention will be described in connection with P type material having holes as the majority carriers. For infra-red detection, the doping of silicon with a material such as zinc, thallium, indium, or gallium will make for a P type material. A diffused layer 14 of low resistivity P type material is formed on the back surface of substrate 11 by doping this surface with an appropriate material such as boron. Similarly diffused layers 16 and 17 are formed on the front surface of the substrate. Diffused layer 16 is not vital to device operation, but improves response speed. Deposited over the entire back surface 11b of the substrate is a conducting electrode 20 which may be, e.g., of aluminum for front illumination, or poly-silicon for back illumination. If a transparent back electrode is used, isolation between the elements of the array can be achieved by a gridwork of non-transparent stripes. A dielectric layer 21 is deposited over most of the front surface 11a of the substrate. This dielectric layer may be of a material such as silicon dioxide. A conductive electrode 25 is deposited over that portion of dielectric layer 21 just above diffused layer 16 and forms a collector electrode. Electrode 25 is of a conductive material which is also transparent to infra-red radiation, such as poly-silicon, unless back-side illumination is employed, in which case electrode 25 may be a metal such as aluminum. Also deposited over dielectric layer 21 are X addressing line 26 and Y addressing line 27. Line 26 is of a conductive material such as aluminum, and line 27 also of a conductive material, such as poly-silicon. The use of aluminum for one address line and poly-silicon for the other allows cross-over of the X and Y address without shorting same. Isolation between address lines is afforded by means of thin insulating layers 28 and 29 which are respectively provided at the interfaces between electrode 25 and electrode 26, and electrode 26 and electrode 27. This may be accomplished by coating the poly-silicon surfaces with an insulating material of silicon dioxide. Alternatively, both lines 26 and 27 may be made of poly-silicon, since the same isolation procedure is effective. In principle, both lines could be of aluminum, but an insulating layer between two layers of aluminum is more difficult to obtain. Signal line 30 which is fabricated of a conductive material such as aluminum is deposited over dielectric layer 21 and contacts the diffused layer 17 in regions 31.

A bias voltage is applied between electrodes 20 and 25, the polarity of this voltage being such as to attract the majority carriers towards collector electrode 25. This bias voltage is typically 10–20 volts.

The device operates as follows: Infra-red radiation as indicated by the arrows 35 passes through collector electrode 25 into substrate 11 and causes the generation of majority carriers therein. These majority carriers are attracted by collector plate 25 and a charge is stored in the diffusion area 16. When both address lines 26 and 27 receives an addressing signal, which in this instance would be a signal having a negative polarity with respect to electrode 25, the charge stored in the diffusion area 16 is transferred over to diffusion area 17 and provides a readout signal on line 30. Collector plate 25 and diffusion area 16 effectively form a storage capacitor for storing the holes generated in response to the infra-red radiation, while X and Y lines 26 and 27, diffusion areas 16 and 17, and signal line 30 effectively form a dual-gate MOSFET for reading out the stored charge. It is to be noted that by fabricating electrode 25 and X and Y lines 26 and 27 close together, a compact structure is provided.

Figure 3:
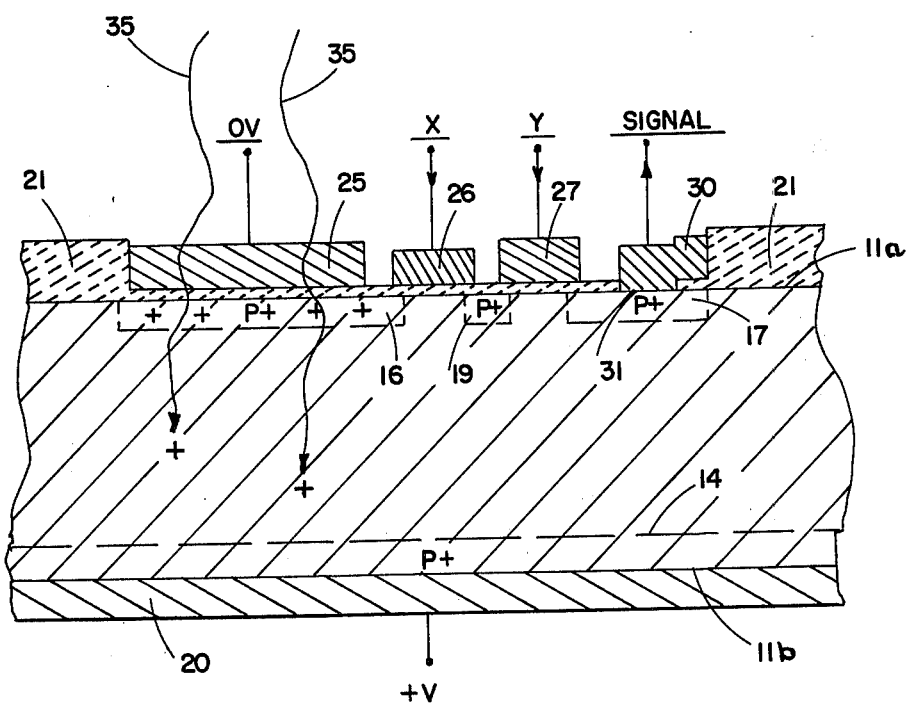
FIG. 3 is a cross-sectional view of an alternative embodiment of the invention.

Referring now to FIG. 3, an alternative configuration for the detector elements is illustrated in cross-section. The second embodiment is the same as the first except for the fact that X and Y lines 26 and 27 are in this embodiment spaced from each other and from collector 25. Also in this second embodiment, an additional diffusion area 19 is provided. Other than this, the structure and operation of this second embodiment is the same as that already described.

Figure 4:
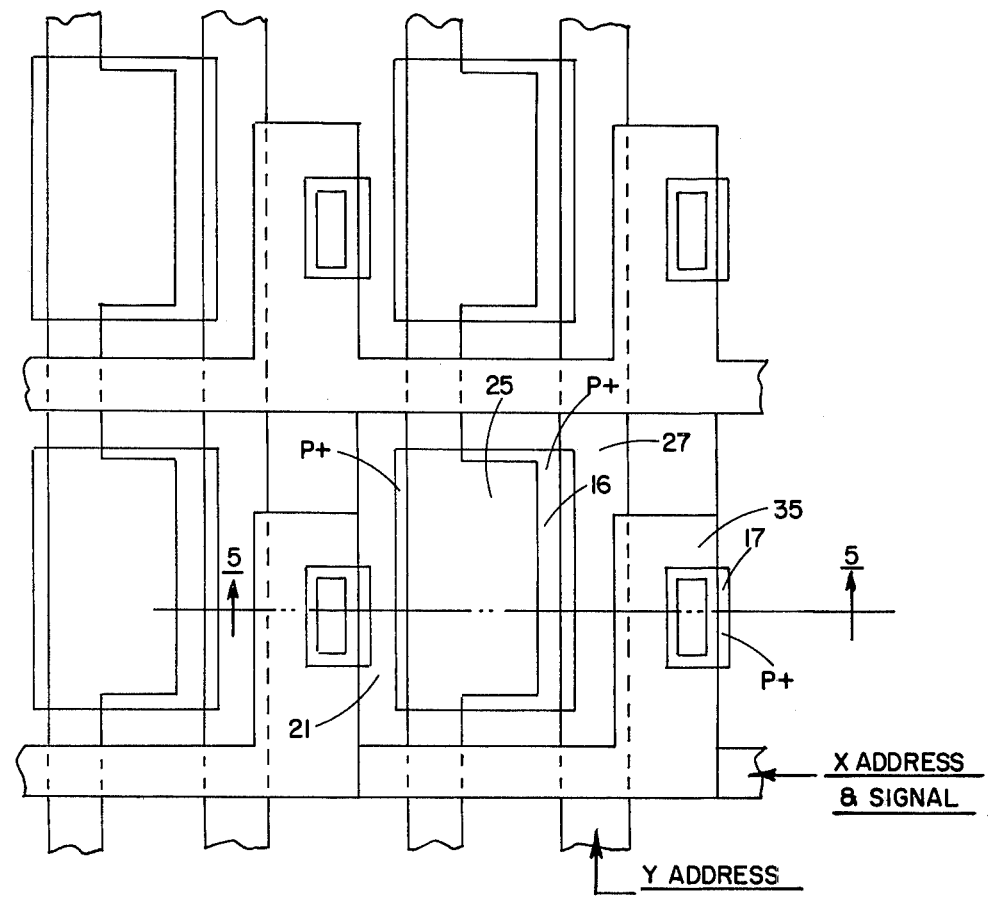
FIG. 4 is a top plan view of still a further embodiment for the invention.
Figure 5:
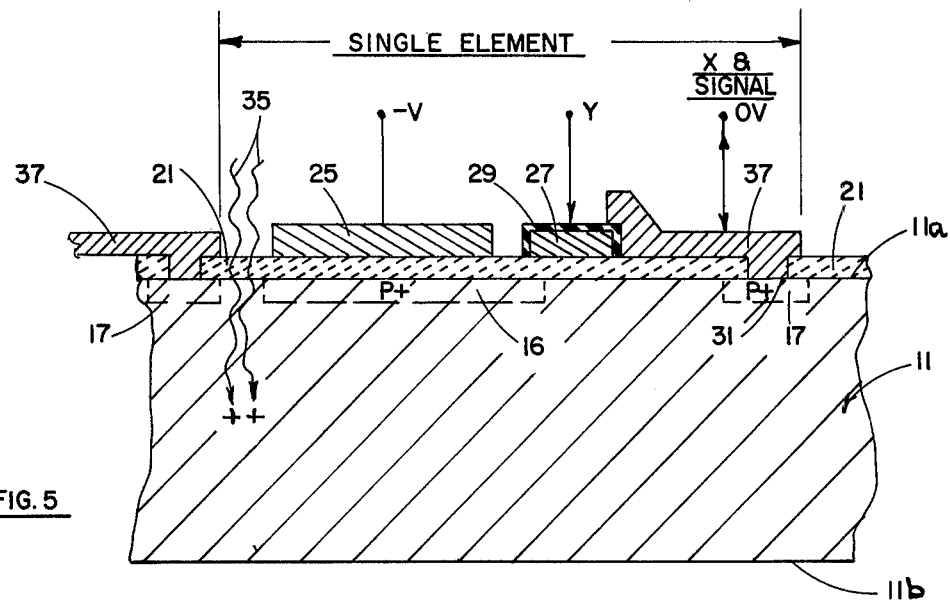
FIG. 5 is a cross-sectional view taken along the plane indicated by 5—5 in FIG. 4.

It should be immediately apparent that the device of the invention can be implemented to equal advantage using N material where appropriate dopants are used which will produce this type of material which will respond to generate majority carriers in response to infra-red radiation. It is to be noted that the elements of this invention can be fabricated in miniature proportions, e.g., each sensing unit could be made to be of the order of 80 micrometers square or less Referring now to FIGS. 4 and 5, a further embodiment of the invention is illustrated, in this embodiment the same line being used for both X address and signal, and the photo-sensitive area lying between diffusion 16 of one cell and diffusion 17 of the adjacent cell.

As for the previous embodiments, this embodiment has a conducting collector electrode 25 which forms one plate of a storage capacitor which stores majority carriers generated by virtue of infra-red radiation 35. Also, as for the previous embodiments, a Y address line 27 is provided. Line 37 serves the dual function of X address line and signal line. In this embodiment no electrode is provided on the bottom surface 11b of the substrate, this surface being left floating. Further, in this embodiment the diffusion 17 under the common X address and signal line 37 is normally kept positive relative to collector electrode 25 except when extracting the accumulated charge from diffusion 16. In implementing this end result, a ground bias potential may be placed on line 37, while a negative potential is placed on electrode 25. This last embodiment has the advantage of smaller size, the elimination of the back surface electrode and the need for fewer connections (by virtue of the combined X address and signal line).

For the device of the invention to function properly, the dark resistivity of the substrate must be large enough so that the dark RC time constant associated with the resistance of the photoresistor and the storate capacitor formed is long compared to the integration time during which photo-generated carriers are being collected. Since the resistivity of appropriately doped material increases rapidly with decreasing temperature, this end result can be easily achieved in each embodiment by appropriately controlling the operating temperature, substrate thickness, and the thickness of the dielectric layer between the substrate and the collector electrode.

While the invention has been described and illustrated in detail, it is to be clearly understood that this is intended by way of limitation, the spirit and scope of the invention being limited only by the following claims:

I claim:

1. An infra-red detector array comprising a plurality of detector elements, each of said elements comprising:
   a substrate of an extrinsic semi-conductor material adapted to generate majority carriers in response to infra-red radiation, said substrate having front and back surfaces through either of which such radiation passes,
   a plurality of majority carrier diffused regions separated from each other and formed along the front surface of the substrate,
   a layer of dielectric material on said front surface,
   a collector electrode deposited over said dielectric layer opposite one of said diffused regions, thereby forming a storage capacitor,
   a conductive signal line deposited on said dielectric layer opposite and making electrical contact with another of said diffusion regions, and
   conductive address line means deposited over said dielectric and positioned between said collector electrode and said signal electrode,
   a biasing potential being applied to said collector electrode so as to attract the majority carriers generated in said substrate by said radiation toward said collector electrode,
   whereby when addressing signals are simultaneously received at both address line means of any detector element, said majority-carrier charge stored in the capacitor formed by the collector electrode, the dielectric layer, and the top surface of the substrate is transferred to the signal line.

2. The device of claim 1 wherein said address line means comprises separate X and Y address lines.

3. The device of claim 1 wherein the side of said substrate opposite said front surface has a diffusion layer formed thereover and a metal electrode deposited on this surface, a biasing potential being applied to said last mentioned electrode so as to repel the majority carriers towards the collector electrode.

4. The device of claim 1 wherein one of said address electrodes and said signal electrode are formed by a single electrode.

5. The device of claim 1 wherein said substrate is formed of silicon treated with a dopant.

6. The device of claim 5 wherein the silicon is treated with a dopant making for a P type material, said dopant being selected from the class consisting of zinc, thallium, indium, and gallium.

7. The device of claim 1 wherein said collector electrode and said X and Y address lines are immediately adjacent to each other, being separated from each other only by thin insulator layers.

8. The device of claim 1 wherein said collector electrode is fabricated of material transparent to infra-red radiation.

9. The device of claim 6 wherein said dielectric layer is of silicon dioxide.

* * * * *